(12) United States Patent
Mitsumune

(10) Patent No.: US 6,537,859 B2
(45) Date of Patent: Mar. 25, 2003

(54) SEMICONDUCTOR DEVICE BAKING METHOD

(75) Inventor: Kazumasa Mitsumune, Kurashiki (JP)

(73) Assignee: Sharp Kabushiki Kaisha, Osaka (JP)

(*) Notice: Subject to any disclaimer, the term of this patent is extended or adjusted under 35 U.S.C. 154(b) by 23 days.

(21) Appl. No.: 09/804,467

(22) Filed: Mar. 13, 2001

(65) Prior Publication Data

US 2001/0034079 A1 Oct. 25, 2001

(30) Foreign Application Priority Data

Mar. 17, 2000 (JP) ........................................ 2000-075914

(51) Int. Cl.[7] ................................................ H01L 21/44
(52) U.S. Cl. ........................ 438/127; 438/112; 438/124; 438/126
(58) Field of Search ................................ 438/106, 125, 438/126, 127, 51, 124, 112, 115

(56) References Cited

U.S. PATENT DOCUMENTS

| | | | | |
|---|---|---|---|---|
| 4,346,449 A | * | 8/1982 | Ovshinsky et al. | 219/216 |
| 5,825,549 A | * | 10/1998 | Kawamata et al. | 359/582 |
| 6,072,243 A | * | 6/2000 | Nakanishi | 257/783 |
| 6,211,277 B1 | * | 4/2001 | Kawata et al. | 524/492 |
| 6,214,904 B1 | * | 4/2001 | Tanaka et al. | 523/409 |
| 6,297,543 B1 | * | 10/2001 | Hong et al. | 257/666 |

* cited by examiner

Primary Examiner—Kevin M. Picardàt
(74) Attorney, Agent, or Firm—Nixon & Vanderhye P.C.

(57) ABSTRACT

A semiconductor chip is encapsulated with resin into a plastic package so as to form a semiconductor device having the semiconductor chip in the plastic package. The semiconductor device is then received in a container so that the container is vacuumed up to a vacuum degree of $10^{-6}$ or less. Thereafter, the semiconductor device is baked at a temperature within a range of 165° C. to 175° C. for 6 hours or more by using a hot plate. Thus, this baking under the reduced pressure prevents generation of blisters and cracks on the plastic package.

9 Claims, 2 Drawing Sheets

SEMICONDUCTOR DEVICE BAKING METHOD

BACKGROUND OF THE INVENTION

The present invention relates to a method for baking a semiconductor device that has a semiconductor element and a resin encapsulated package.

Semiconductor devices such as a transistor, an integrated circuit (IC) and a large scale integrated circuit (LSI) are each encapsulated in a ceramic package, a plastic package or the like. The plastic package is going mainstream, except for particular specifications, since it is especially excellent in terms of cost and productivity.

FIG. 2 is a schematic sectional view of a semiconductor device that has a plastic package of the thin small outline package (TSOP) type or the like. This semiconductor device 100 shown in FIG. 2 has assembly processes as follows.

First of all, a die bonding paste containing an organic solvent is coated on a frame 101 made of alloy, and a semiconductor chip 102 bis die-bonded onto the frame 101.

Next, the semiconductor chip 102 and the frame 101 are subjected to a heating process in an $N_2$ atmosphere by means of an oven and thereafter to a wire bonding process to connect the semiconductor chip 102 with lead terminals 103 and 103 by way of Au wires 106 and 106.

Next, before performing resin encapsulation, a polyimide based resin (PIQ) film 104 is formed on a surface of the frame 101 opposite to the semiconductor chip 102 in order to secure adhesion of the frame 101 to a plastic package 105. Thereafter, the PIQ film 104 is subjected to a heating process for hardening it.

Next, resin is molded into the package 105 of the TSOP type by a molding press after completing the heating process of the PIQ film 104, and then the package 105 of the TSOP type is subjected to a heating process in a $N_2$ atmosphere.

Next, the lead terminals 103 and 103 are formed, subjected to a plating process, and followed by a baking process.

In a conventional baking method of a semiconductor device, moisture absorbed in the plastic package 105 and organic components contained in the plastic package 105 are removed by subjecting the semiconductor device 100 to the baking process at a temperature 150° C. for one hour in a $N_2$ atmosphere at the atmospheric pressure.

However, the aforementioned semiconductor device baking method is not able to sufficiently remove the organic components contained in the plastic package 105. Consequently, if a reflow process is performed at a temperature of e.g. 230° C. for three minutes to connect the semiconductor device 100 to a circuit substrate, there occurs a problem that a blister 105a shown in FIG. 3 or cracks are generated in the plastic package 105.

SUMMARY OF THE INVENTION

Accordingly, the present invention has an object of providing a semiconductor device baking method capable of preventing deformation such as blisters and cracks of a plastic package.

In order to achieve the aforementioned object, the present invention provides a semiconductor device baking method for baking a semiconductor device that has a semiconductor element and a resin encapsulated package, comprising the steps of: encapsulating the semiconductor element with resin into the resin encapsulated package; and baking the resin encapsulated package in a reduced-pressure atmosphere.

According to the present invention, it has been found that moisture and organic components inside the resin encapsulated package are easily discharged out of the resin encapsulated package by baking the resin encapsulated package in the reduced-pressure atmosphere. As a result, the moisture and the organic components inside the resin encapsulated package are sufficiently reduced, so that the resin encapsulated package can be prevented from deformation such as blisters and cracks in, for example, the reflow process after the baking process.

In one embodiment of the present invention, the reduced-pressure atmosphere is an atmosphere having a vacuum degree of $10^{-6}$ torr or less.

According to the above embodiment, deformation such as blisters and cracks in the resin encapsulated package can more reliably be prevented by setting the reduced-pressure atmosphere to $10^{-6}$ torr or less.

If the reduced-pressure atmosphere is greater than the value of $10^{-6}$ torr, the moisture and the organic components inside the resin encapsulated package are insufficiently removed.

In one embodiment of the present invention, the resin encapsulated package is heated within a temperature range of 165° C. to 175° C. in the step of baking the resin encapsulated package.

According to the above embodiment, deformation such as blisters and cracks in the resin encapsulated package can more reliably be prevented by baking the resin encapsulated package within the temperature range of 165° C. to 175° C.

If the baking is performed at a temperature lower than 165° C., the moisture and the organic components inside the resin encapsulated package are insufficiently removed.

If the baking process temperature exceeds 175° C., the resin encapsulated package suffers heat damages.

In one embodiment of the present invention, the resin encapsulated package is heated for 6 hours or more in the step of baking the resin encapsulated package.

According to the above embodiment of the present invention, the deformation such as blisters and cracks in the resin encapsulated package can more reliably be prevented by heating the resin encapsulated package for 6 hours or more.

If the heating time of the resin encapsulated package is less than 6 hours, the moisture and the organic components inside the resin encapsulated package are insufficiently removed.

In one embodiment of the present invention, the resin encapsulated package belongs to a TSOP type.

According to the above embodiment of the present invention, deformation such as blisters and cracks in the resin encapsulated package can effectively be prevented since the resin encapsulated package belongs to the TSOP type.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
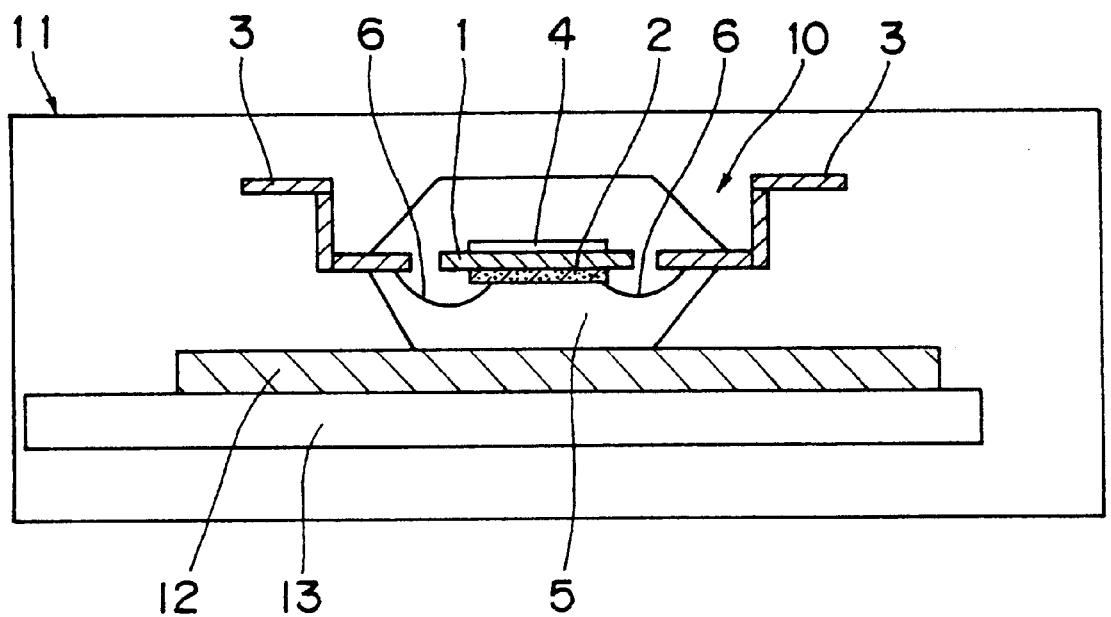
FIG. 1 is a schematic structural view of an essential part of a vacuum unit used in a semiconductor device baking method according to one embodiment of the present invention.
Figure 2:
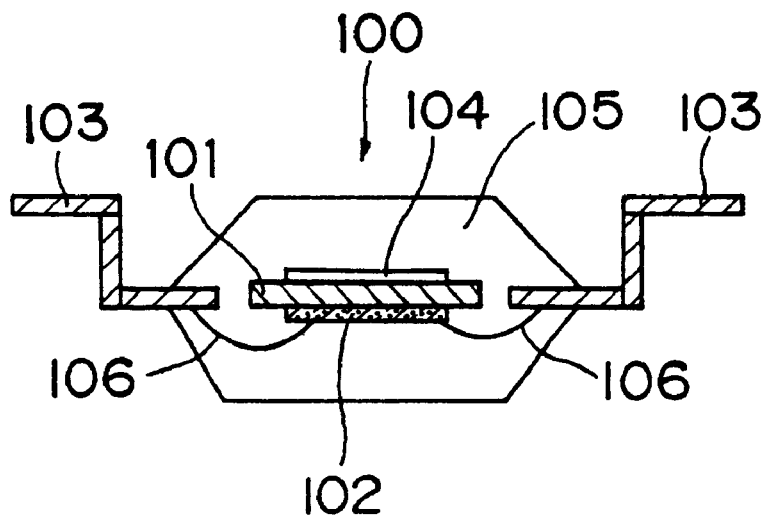
FIG. 2 is a schematic sectional view of a semiconductor device to be processed by a conventional semiconductor device baking method.

A semiconductor device baking method of the present invention will be described in detail below based on an embodiment thereof shown in the drawings.

FIG. 1 is a schematic structural view of a vacuum unit used in a semiconductor device baking method according to one embodiment of the present invention. As shown in FIG. 1, this vacuum unit has a container 11 for receiving a semiconductor device 10, a hot plate 13 for baking the semiconductor device 10, and an heat-equalizing Al stage 12 interposed between the hot plate 13 and the semiconductor device 10. Two types of exhaust systems which are a rotary pump and a diffusion pump, not shown in the figure, are used for making inside of the container 11 in a reduced-pressure atmosphere.

The semiconductor device 10 has a frame 1 made of an alloy, a semiconductor chip 2 that serves as a semiconductor element to be mounted on the frame 1, lead terminals 3 to be connected with the semiconductor chip 2 by way of Au wires 6, a PIQ film 4 that is formed on the frame 1, and a plastic package 5 that serves as a resin encapsulated package for encapsulating the semiconductor chip 2. The PIQ film 4 improves adhesion of the frame 1 to the plastic package 5.

The semiconductor device 10 is fabricated as follows.

I. First of all, a die bonding paste containing an organic solvent is coated on the alloy frame 1 so as to die-bond the semiconductor chip 2 onto the frame 1. The die bonding paste contains components of 68 to 72% of Ag, 18 to 22% of epoxy resin and 3 to 7% of 2-(2-ethoxyethoxy) acetate, for example.

II. Next, a heating process is performed at a temperature of 180° C. for one hour in the $N_2$ atmosphere. In this stage, with the above-stated die bonding paste, the semiconductor chip 2 and the frame 1 are satisfactorily adhered to each other, whereas the organic components are insufficiently volatilized.

III. Next, wire bonding is performed to connect the semiconductor chip 2 with the lead terminals 3 by the Au wires 6.

IV. Next, a PIQ film 4 is formed on a surface of the frame 1 which surface is located on the side opposite to the semiconductor chip 2. The semiconductor chip 2 is coated with a PIQ coat by a wafer process. The PIQ film 4 contains the components of 68 to 70% of N-methyl-2-pyrrolidone (NMP), 16 to 18% of diisobutyl ketone and 12 to 16% of polyimide resin, for example.

V. Next, a heating process is performed at a temperature of 100° C. for one hour in the $N_2$ atmosphere, and thereafter, another heating process is performed at a temperature of 260° C. for one hour in the $N_2$ atmosphere. The solvent in the PIQ film 4 is volatilized during this heating process, and the PIQ film 4 is imidized by dehydrating polymerization. It is known that the formation rate of this imide is not smaller than 90% by the KBr method using Fourier-Transformation Infrared Spectroscopy (FT-IR), which is one of the infrared spectroscopic methods. The PIQ film 4 scarcely absorbs moisture after being hardened. The moisture absorption ratio thereof is 1% in the saturation condition of 40° C./80% and 12 hours or more.

VI. Next, in order to encapsulate the semiconductor chip 2, epoxy resin is molded into the TSOP type plastic package 5 under the condition that a load of 100 kgf is applied to the epoxy resin for 85 seconds at a metal mold temperature of 165° C. In this stage, the PIQ film 4 secures adhesion between the frame 1 and the plastic package 5. The epoxy resin, which is used as a material for the plastic package 5, has the generic characteristics of a flexural modulus of $2200\pm300$ kgr/mm$^2$, a flexural strength of $15\pm3$ kgr/mm$^2$, a glass transition temperature of $115\pm15°$ C., a thermal expansion coefficient of $1.2\pm0.3\times10^{-5}/°$ C., a specific gravity of $1.94\pm0.03$, a thermal time hardness of not smaller than 70 and a water absorption coefficient of not higher than 0.6%.

VII. Next, the plastic package 5 is baked at a temperature of 180° C. for one hour in the $N_2$ atmosphere. Subsequently, the lead terminals 3 are cut and plated.

Figure 3:
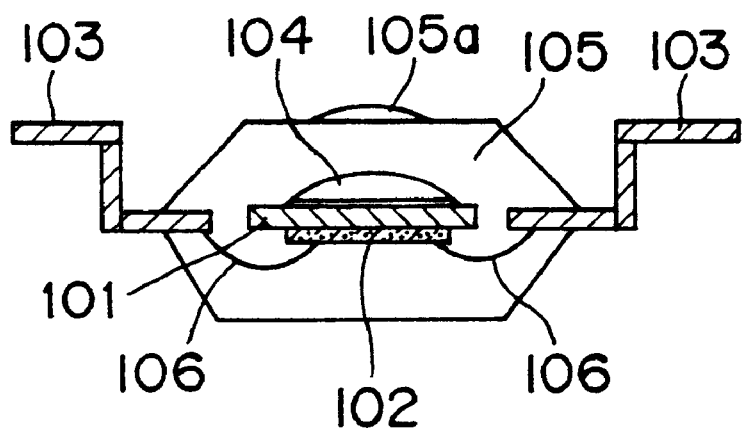
FIG. 3 is a schematic sectional view of the semiconductor device after a reflow process in the conventional method.

In this stage, regarding the moisture absorption characteristic of the plastic package 5, the moisture absorption coefficient of the plastic package 5 is not higher than 0.1%/400 h except for a moisture absorption coefficient of 0.3%/400 h under the particular conditions of 85° C. and 85%. As described above, when the moisture absorption coefficient of the plastic package 5 is not higher than 0.1%/400 h, discharge of the moisture in the plastic package 5 is completed by carrying out the baking process at a temperature of 150° C. for 10 hours in the $N_2$ atmosphere. However, when a reflow process is carried out, for example, at a temperature of 230° C. for three minutes after carrying out the baking process at a temperature of 150° C. for 10 hours in the $N_2$ atmosphere, a blister as shown in FIG. 3 or cracks are generated in the plastic package 5. After subjecting the blister portion of this plastic package 5 to heating at a temperature of 200° C. for three minutes, gas generated from the blister portion is analyzed by gas chromatography. As a result, there were detected diethylene glycol monoethyl ether, diethylene glycol monoacetate and N-methyl-2-pyrrolidone. Therefore, it is understood that the organic component of the die bonding paste and the organic component of the PIQ film 4 are remaining in the plastic package 5. Further, as the result of performing mass spectrometry of the gas generated from the blister portion of the plastic package 5, the blister volume of the plastic package 5 and the amount of generated gas almost coincided with each other. Therefore, it could be confirmed that the blister and cracks on the plastic package 5 were generated due to vaporization of the organic components in the plastic package 5 through the reflow process of the plastic package 5.

Accordingly, the baking process was carried out at a temperature of 170° C. to detect the discharge of the organic components from the plastic package 5 to the outside by gas chromatographic analysis. However, gas discharge to such an extent that a blister was generated could not be confirmed. The imidization rate of the PIQ film 4 inside the plastic package 5 did not progress at a temperature of 150° C. in 10 hours, whereas the progress in the imidization rate could be confirmed at a temperature of 170° C. in ten hours. Therefore, it is presumed that the solvent remaining in the PIQ film 4 is not discharged from the plastic package 5 to the outside despite the vaporization of the solvent remaining in the PIQ film 4 inside the plastic package 5 even at the temperature of 170° C.

Accordingly, in order to discharge the solvent remaining in the PIQ film 4 to the outside, the baking process is carried out under the reduced-pressure. Table 1 shows the test results after test samples are baked under the reduced-pressures of $10^{-2}$, $10^{-4}$ or $10^{-6}$ torr at the temperature of 170° C. for 2, 3 or 6 hours. Table 2 shows the test results after test samples are baked under the reduced-pressure of $10^{-6}$ torr at the temperatures of 170° C. and 150° C. for 3 or 6 hours. Thereafter, the samples are subjected to a humidifying process under the conditions of 85° C., 85% and 12 hours. The samples are then subjected to the reflow process of a temperature 235° C. for 30 seconds, so that surfaces of the samples are evaluated by using a metallurgical microscope with a magnifying power of 500.

TABLE 1

| Baking Process Conditions | | Evaluated after Reflow Process (Presence or Absence of Blister Portion/State of Surface) | | |
|---|---|---|---|---|
| Temperature (° C.) | Vacuum (torr) | Heating for Two Hours | Heating for Three Hours | Heating for Six Hours |
| 170 | $10^{-2}$ | NG/NG | NG/NG | |
| | $10^{-4}$ | | OK/NG | |
| | $10^{-6}$ | | | OK/OK |

TABLE 2

| Baking Process Conditions (Two Hours of Cooling Time is Provided after Baking Process) | | | Evaluated after Reflow Process (Presence or Absence of Blister Portion/State of Surface) | |
|---|---|---|---|---|
| Degree of Vacuum | Temperature (° C.) | Time (h) | Evaluation | Mode |
| $10^{-6}$ | 170 | 6 | OK/OK | No Abnormality |
| | 150 | 6 | NG/OK | Blisters and Cracks |
| | 170 | 3 | OK/NG | Surface Roughness |

As shown in Table 1, when the baking is carried out at a temperature of 170° C. for two hours or three hours under an atmosphere of a vacuum degree of $10^{-2}$ or $10^{-4}$, blisters or cracks may be generated in the plastic package 5 through the subsequent reflow process. However, when the baking is carried out for 6 hours under an atmosphere of a vacuum degree of $10^{-6}$, neither blister nor crack is generated through the subsequent reflow process. Consequently, it is found that the vacuum degree of the baking process should preferably be made not greater than $10^{-6}$.

As shown in Table 2, even if the baking is carried out under the vacuum degree of $10^{-6}$, blisters, cracks or surface chapping is generated on the plastic package 5 by the subsequent reflow process in the case of baking at a temperature of 150° C. for 6 hours or at a temperature of 170° C. for three hours. Therefore, it is found that that the heating time in the baking process should preferably be 6 hours or more at a temperature of 170° C. as well as that the vacuum degree should preferably be made not greater than $10^{-6}$.

Therefore, it is found that the plastic package 5 is prevented from generation of blister and cracks through the subsequent reflow process by making an $N_2$ atmosphere inside the container 11 shown in FIG. 1 into a vacuum degree of not greater than $10^{-6}$ and heating the semiconductor device 10 at a temperature within a range of 165° C. to 175° C. for 6 hours or more by means of the hot plate 13.

Stress inside the plastic package 5 due to the volatile organic components are reduced by heating the semiconductor device 10 at a temperature within a range of 165° C. to 175° C. for 6 hours or more in the atmosphere of not greater than $10^{-6}$ vacuum degree. Therefore, it is presumed that the stress reduction effectively prevents chip cracks, disconnection of wires and reduction in adhesion between the frame 1 and the plastic package 5.

When the semiconductor device is subjected to a temperature higher than 175° C. in the baking process, this temperature may exceed the maximum heatproof temperature of is the plastic package 5, and therefore, the plastic package 5 may suffer heat damage.

Adhesive properties between the PIQ film 4 and the plastic package 5 and between the frame 1 and the plastic package 5 are evaluated with an adhesion tester. The results obtained by this evaluation are the following I to III. These I to III contribute much to investigation on the cause of blisters on the package.

I. When the imidization rate of the PIQ film 4 is within a range of 85 to 95%, there is no problem in the property of adhesion between the PIQ film 4 and the plastic package 5.

II. When baking is carried out at a temperature of 175° C. for five hours after molding the plastic package 5, both adhesion strengths between the PIQ film 4 and the plastic package 5 and between the frame 1 and the plastic package 5 increase.

III. The adhesion strength between the frame 1 and the plastic package 5 in the absence of the PIQ film 4 is lower than that in the presence of the PIQ film 4 even if the baking is carried out at a temperature of 175° C. for five hours.

In the aforementioned embodiment, the plastic package 5 is the TSOP type. However, the plastic package may be the TQFP type.

The invention being thus described, it will be obvious that the invention may be varied in many ways. Such variations are not be regarded as a departure from the spirit and scope of the invention, and all such modifications as would be obvious to one skilled in the art are intended to be included within the scope of the following claims.

What is claimed is:

1. A semiconductor device baking method for baking a semiconductor device that has a semiconductor element and a resin encapsulated package, the method comprising:

encapsulating the semiconductor element with resin into the resin encapsulated package via a molding process; and after the molding process, baking the resin encapsulated package in a reduced-pressure atmosphere having a pressure less than atmospheric pressure.

2. A semiconductor device baking method as set forth in claim 1, wherein the reduced-pressure atmosphere is an atmosphere having a vacuum degree of $10^{-6}$ torr or less.

3. A semiconductor device baking method as set forth in claim 2, wherein the resin encapsulated package is heated within a temperature range of 165° C. to 175° C. in the step of baking the resin encapsulated package.

4. A semiconductor device baking method as set forth in claim 3, wherein the resin encapsulated package is heated for 6 hours or more in the step of baking the resin encapsulated package.

5. A semiconductor device baking method as set forth in claim 1, wherein the resin encapsulated package belongs to a TSOP type.

6. A semiconductor device baking method as set forth in claim 4, wherein the resin encapsulated package belongs to a TSOP type.

7. A method of making a semiconductor device, the method comprising:

attaching a semiconductor element to a support;

encapsulating the semiconductor element with a resin via a molding process thereby forming an encapsulating resin; and after the molding, baking the encapsulating resin at pressure of $10^{-6}$ torr or less.

8. The method of claim 7, wherein the baking comprising baking the encapsulating resin at pressure of $10^{-6}$ torr or less for at least six hours.

9. The method of claim 7, wherein the baking comprises heating the encapsulating resin to temperature(s) from 165 to 175 degrees C.

* * * * *